United States Patent [19]
Hill et al.

[11] Patent Number: 5,391,504
[45] Date of Patent: Feb. 21, 1995

[54] METHOD FOR PRODUCING INTEGRATED QUASI-COMPLEMENTARY BIPOLAR TRANSISTORS AND FIELD EFFECT TRANSISTORS

[75] Inventors: Darrell Hill, Plano; Albert H. Taddiken, McKinney, both of Tex.

[73] Assignee: Texas Instruments Incorporated, Dallas, Tex.

[21] Appl. No.: 147,108

[22] Filed: Nov. 3, 1993

Related U.S. Application Data

[63] Continuation of Ser. No. 923,046, Jul. 31, 1992, abandoned.

[51] Int. Cl.$^6$ ............................................. H01L 21/265
[52] U.S. Cl. ................................. 437/31; 437/59; 437/126; 437/133; 148/DIG. 9; 148/DIG. 72
[58] Field of Search ............... 437/31, 59, 34, 56, 437/57, 126, 133; 148/DIG. 72, DIG. 9

[56] References Cited

U.S. PATENT DOCUMENTS

| | | | |
|---|---|---|---|
| 4,981,808 | 1/1991 | Hayes | 437/31 |
| 4,996,163 | 2/1991 | Sasaki | 437/59 |
| 5,068,705 | 11/1991 | Tran | 257/197 |
| 5,077,231 | 12/1991 | Plumton et al. | 148/DIG. 9 |
| 5,213,987 | 5/1993 | Bayraktahoglu | 437/31 |
| 5,223,449 | 6/1993 | Morris et al. | 437/56 |
| 5,294,566 | 3/1994 | Mori | 437/31 |

FOREIGN PATENT DOCUMENTS

| | | | |
|---|---|---|---|
| 0144242 | 6/1985 | European Pat. Off. | 257/197 |
| 0069943 | 3/1990 | Japan | 437/31 |
| 0109360 | 4/1990 | Japan | 257/197 |
| 0142179 | 5/1990 | Japan | 257/197 |

*Primary Examiner*—Brian E. Hearn
*Assistant Examiner*—Tuan Nguyen
*Attorney, Agent, or Firm*—Michael K. Skrehot; James C. Kesterson; Richard L. Donaldson

[57] ABSTRACT

Generally, and in one form of the invention, an integrated circuit comprising a bipolar transistor and a field effect transistor, wherein a channel of the field effect transistor and a base of the bipolar transistor are formed from a base epitaxial layer 16, and whereby field effect and bipolar transistors are formed within a common material structure is disclosed. In another form of the invention, an integrated circuit comprising a substrate 10, an epitaxial subcollector layer 12, an epitaxial collector layer 14, an epitaxial base layer 16, an epitaxial emitter layer 18, a bipolar transistor formed with an emitter electrical contact 20, 28, 35 to the emitter layer 18, a base contact 34 to the base layer 16, and a collector contact 42 to the subcollector layer 12, and a field effect transistor formed with a first gate contact 20, 30, 39 to the emitter layer 18, a first source contact 36 to the base layer 16, and a first drain contact 37 to the base layer 16, is disclosed.

12 Claims, 3 Drawing Sheets

METHOD FOR PRODUCING INTEGRATED QUASI-COMPLEMENTARY BIPOLAR TRANSISTORS AND FIELD EFFECT TRANSISTORS

This application is a continuation of application Ser. No. 07/923,046, filed Jul. 31, 1992, now abandoned.

FIELD OF THE INVENTION

This invention generally relates to a method of integrating bipolar transistors with field effect transistors.

BACKGROUND OF THE INVENTION

Without limiting the scope of the invention, its background is described in connection with monolithic circuits with integrated heterojunction bipolar transistors (HBTs) and junction field effect transistors (JFETs), as an example.

Heretofore, in this field, efforts to combine bipolar and field effect transistor technologies have been undertaken because of the attractive combination of the high power of bipolar and the low power switching and logic made possible with field effect devices together on a monolithic chip. These past attempts have met with limited success primarily because the field effect devices had to be designed to be accomodated within a process and material structure better suited for bipolar transistors. Additionally, the additional process steps required to include field effect devices increased the complexity of the process and contributed to poor producibility and yield. Solutions that overcome the limitations of these past methods would be desirable.

SUMMARY OF THE INVENTION

The advantages of combining HBTs and JFETs on integrated circuits have been recognized in the past. The speed, power, and linearity of HBTs combined with the densely packed, low power logic or memory possible with FETs allows the integration of functions on a single chip that traditionally required two or three. However, past solutions have generally integrated FETs using processes and materials more suited to HBTs than to FETs. Consequently, the addition of FETs has generally been accomplished only with additional lithographic or epitaxial growth steps. The present invention, however, makes no such concessions in order to include FET devices. No additional lithographic steps are required to include FETs, and no additional epitaxial growths are required.

Quasi-complementary circuitry, n- and p-type devices of different device families (i.e. a pnp HBT with an n-channel FET, or a npn HBT with a p-channel FET), has not been widely utilized with prior art processes despite significant potential benefit to circuit performance and efficiency. This is probably because in the past, it has apparently been assumed that better performance is obtained by the use of npn HBTs. The combination of npn HBTs and p-channel FETs is not straightforward because the p-layer used for the HBT base is not suitable for the channel of the FET; it is typically relatively highly doped and therefore difficult to pinch off. If the performance of the npn HBT is not to be seriously compromised, then the FET channel must be introduced elsewhere into the structure. Even if a separate FET channel is used, the FET performance is limited because of the low mobility of holes in GaAs.

In contrast, the present invention makes use of pnp HBTs integrated with n-channel FETs. The base of a pnp HBT typically is thinner and more lightly doped than that of an npn with comparable $f_{max}$. Consequently, when used as a FET channel, the pnp base layer is pinched off with a much lower voltage. Also, the resulting n-channel FET will have much higher performance ($f_t$, transconductance) than is possible with p-channel FETs in GaAs.

Prior art methods rely on ion implantation and/or diffusion to form part of the HBT or FET. This is at the very least an additional processing step, but a more important limitation is that of the anneal that is required to repair damage caused by the implant. Anneal temperatures are typically in the range around 800° C. Process steps that come before this anneal have to be able to withstand the anneal temperatures. Metals are particularly vulnerable to the high temperatures characteristic of an anneal. Ohmic contacts, often alloyed around 450° C., can be destroyed by the high temperatures. Metals, in general, have to be carefully chosen to have a thermal coefficient of expansion that allows them to be subjected to high temperatures without delaminating from the GaAs substrate. One can see that the use of implantation to deposit dopants in a process severely limits the processing that can be done prior to implantation. No implantation of dopants to form an active region of a device is required in the present invention. All device-related doping is done in situ in the formation of the epitaxial layers making up the material structure of the device. Also, the FET device is formed utilizing the same mesa etching techniques of the HBT. There is no need for implantation to form the FET channel.

Generally, and in one form of the invention, an integrated circuit comprising a bipolar transistor and a field effect transistor, wherein a channel of the field effect transistor and a base of the bipolar transistor are formed from the same epitaxial layer, and whereby field effect and bipolar transistors are formed within a common material structure is disclosed.

In another form of the invention, an integrated circuit comprising a substrate, an epitaxial subcollector layer, an epitaxial collector layer, an epitaxial base layer, an epitaxial emitter layer, a bipolar transistor formed with an emitter electrical contact to the emitter layer, a base contact to the base layer, and a collector contact to the subcollector layer, and a field effect transistor formed with a first gate contact to the emitter layer, a first source contact to the base layer, and a first drain contact to the base layer, is disclosed. Epitaxial depositions and resulting layers, or portions thereof, are referred to herein by the function in the bipolar transistor. Thus, part of the "base" layer serves as a source/channel/drain region for the field effect transistor.

The inventive process described herein is thought to be the first process capable of producing high quality quasi-complementary HBTs and FETs on the same substrate without the ion implantation of dopants. It also appears to be the simplest method of including FETs in a material structure designed to accomodate HBTs. The process described herein requires no additional process steps over that required to produce an HBT. Finally, the combination of prp HBTs and n-channel FETs is thought to be superior in performance to other combinations.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
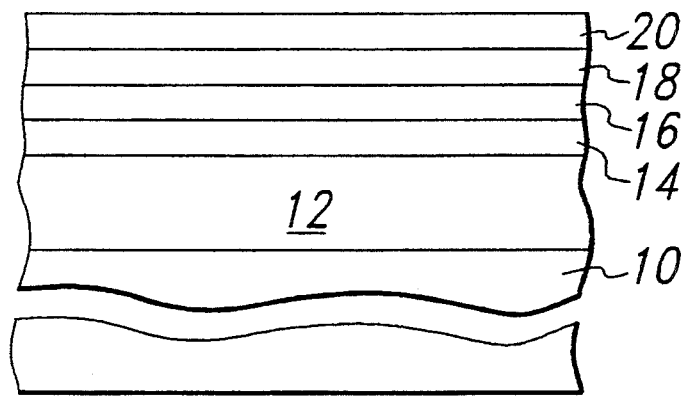
FIGS. 1–7 are cross-sectional views of the first preferred embodiment device at various stages of completion.

The epitaxial material structure of which the first preferred embodiment devices are formed is shown in FIG. 1. In the preferred embodiment structure a subcollector layer 12 of p-type GaAs, for example, is epitaxially grown on a substrate of semi-insulating GaAs 10 by a suitable process (such as molecular beam epitaxy or metal-organic chemical vapor deposition) to a thickness of preferably 1 μm and doped with C, for example, to a concentration of approximately $5 \times 10^{18}$ cm$^{-3}$. C is preferred as its diffusivity is very low (e.g. as compared to Zn). A collector layer 14 is epitaxially grown of, for example, GaAs, preferably 0.5 μm thick, p-doped at approximately $3 \times 10^{16}$ cm$^{-3}$ with C, for example. A base layer 16 is grown of, for example, GaAs, preferably 50 nm thick, n-doped at approximately $2 \times 10^{18}$ cm$^{-3}$ with Si, for example. An emitter layer 18, of AlGaAs for example, and emitter cap layer 20 are grown; the emitter layer is preferably 50 nm thick, p-doped at approximately $1 \times 10^{18}$ cm$^{-3}$ with C, for example; the emitter cap layer, of GaAs, for example is preferably 300 nm thick, doped at approximately $5 \times 10^{19}$ cm$^{-3}$ with C, for example.

Figure 2:
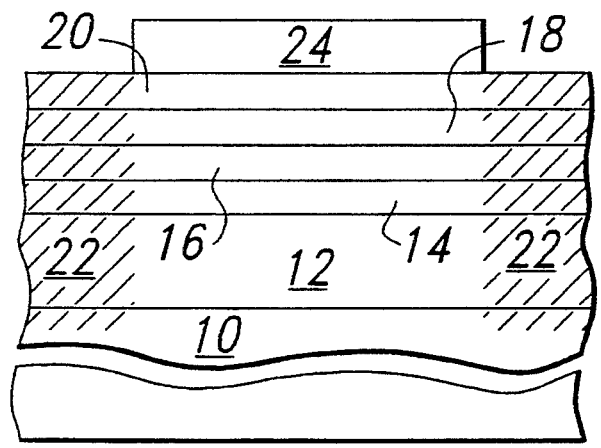

Photoresist (not shown) is used in an evaporation and liftoff procedure to deposit approximately 4.0 μm Au 24 over an area that defines the active device region. The Au 24 acts as a mask for an approximately 5 MeV $O_2$ implant which serves to isolate the active device region on the semiconductor wafer by converting the emitter, base, collector, and subcollector layers to semi-insulating regions. It should be noted that this implant does not involve placing dopants in the active region of a device. It only serves to convert the doped layers surrounding the devices to a semi-insulating state. The resulting structure is shown in FIG. 2, where the isolated region 22 is shown shaded.

Figure 3:
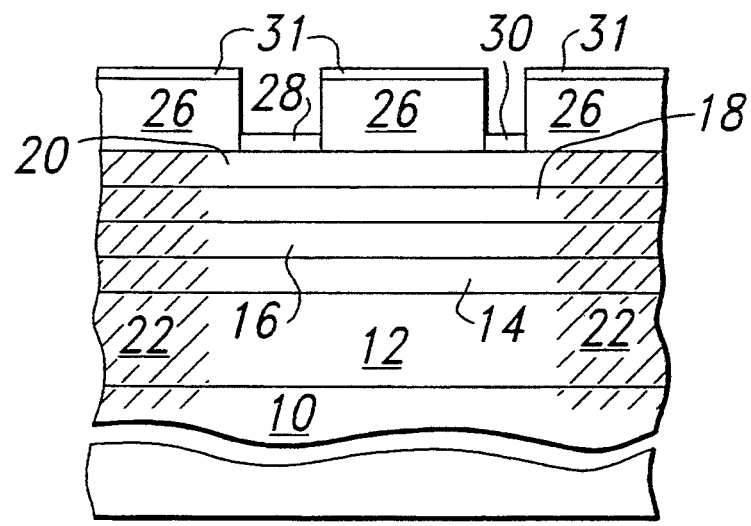

Photoresist 26 is used to define a metal emitter contact 28 and gate metal 30 consisting of, for example, 20 nm Ti/20 nm Pt/100 nm Au, shown in FIG. 3. The photoresist 26 is then removed to lift off excess contact metal 31.

Figure 4:
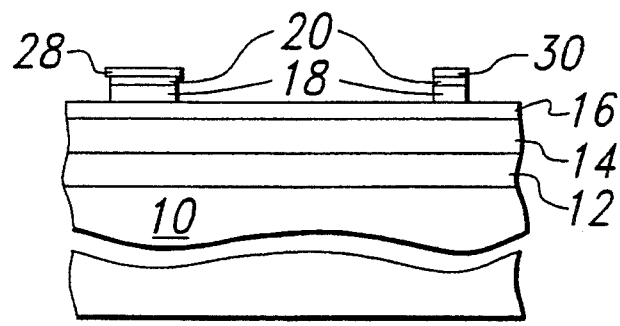

Emitter contact layer 20 and emitter layer 18 are then removed using a solution of $H_2SO_4:H_2O_2:H_2O$ (1:8:160 by volume), for example. This exposes the base layer 16; the emitter contact metal 28 and gate metal 30 serve as a natural mask for the emitter etch. The etch slightly undercuts the emitter contact metal 28. The resulting structure is shown in FIG. 4.

Figure 5:
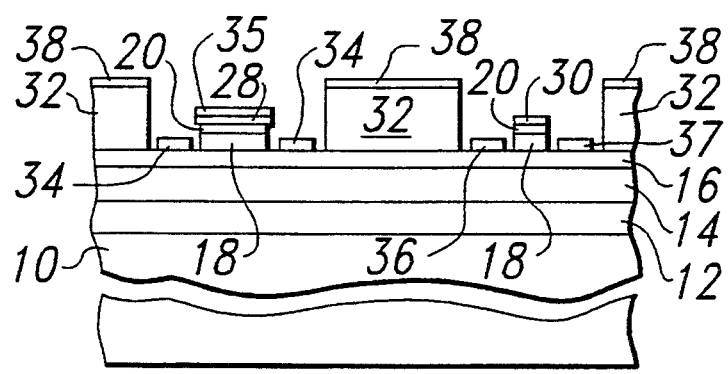

Photoresist 32 is used to define metal base contacts 34 and source 36 and drain 37 metal contacts consisting of, for example, 50 nm AuGe/14 nm Ni/200 nm Au, which are deposited by evaporation. The excess metallization 38 is then lifted off with the photoresist. Some base metal also is deposited on the emitter mesas during the evaporation. This is shown as contact 35 in FIG. 5. Due to the undercut profile of the base etch, the contact 35 is electrically isolated from the base contacts 34.

Figure 6:
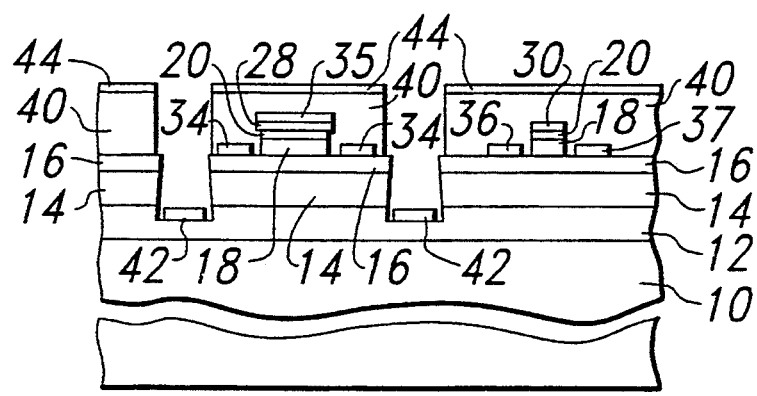
Figure 7:
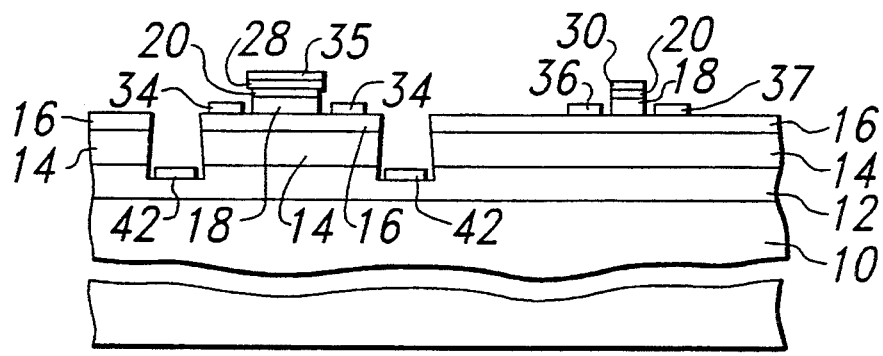

Photoresist 40 is used for a patterned etch to expose the subcollector layer 12. The same photoresist 40 is used in a lift off process to deposit collector contact metal 42, for example, 10 nm Au/150 nm AuZn/100 nm Au. After collector metallization 42 is evaporated, excess metallization 44 is lifted off with the removal of photoresist 40. The structure prior to lift off is shown in FIG. 6. The structure after liftoff is shown in FIG. 7. This represents a first embodiment of the inventive concept of the quasicomplementary integration of PNP HBTs and n-channel JFETs. The HBT includes the emitter mesa (35, 28, 20 and 18), base contacts 34, and collector contacts 42. The JFET is represented in FIG. 7 and includes the gate mesa (39, 30, 20 and 18), source contact 36, and drain contact 37.

Figure 8:
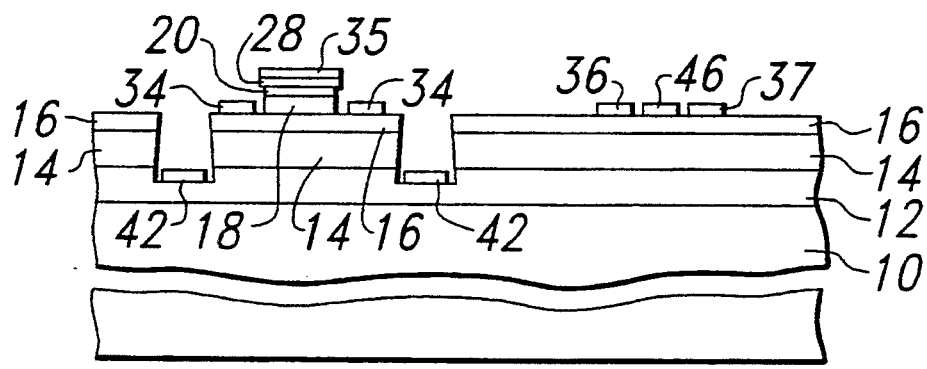
FIG. 8 is a cross-sectional view of the second preferred embodiment device.

A second preferred embodiment structure is shown in FIG. 8. The HBT is represented as it is in FIG. 7, but the JFET has been replaced by a MESFET. This structure was fabricated in a similar way to the first preferred embodiment structure, but instead of forming a gate mesa, gate metal 46 is applied directly to base layer 16. If desired, a gate recess etch may be performed before application of gate metal 46 to modify the threshold voltage of the FET. This metal-semiconductor interface forms the Shottky junction characteristic of a MESFET device.

Figure 9:
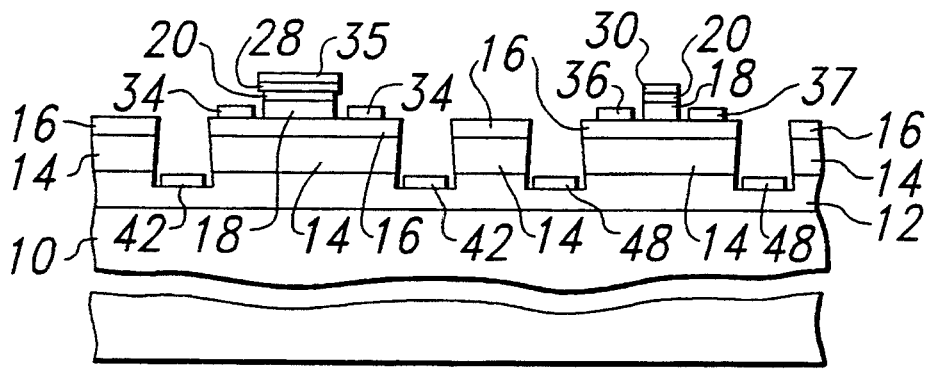
FIG. 9 is a cross-sectional view of the third preferred embodiment device.

A third preferred embodiment structure is shown in FIG. 9. Again, the HBT structure is unchanged from the first and second embodiments. However, the FET, instead of depending only on channel control from a gate mesa, includes contacts 48 to the subcollector 12 and collector 14 layers as well. In some implementations the gate mesa (39, 30, 20 and 18) could be connected to backgate contacts 48. This allows the channel region, in layer 16 underneath he gate mesa, to be depleted with less applied voltage than with the gate mesa alone.

Figure 10:
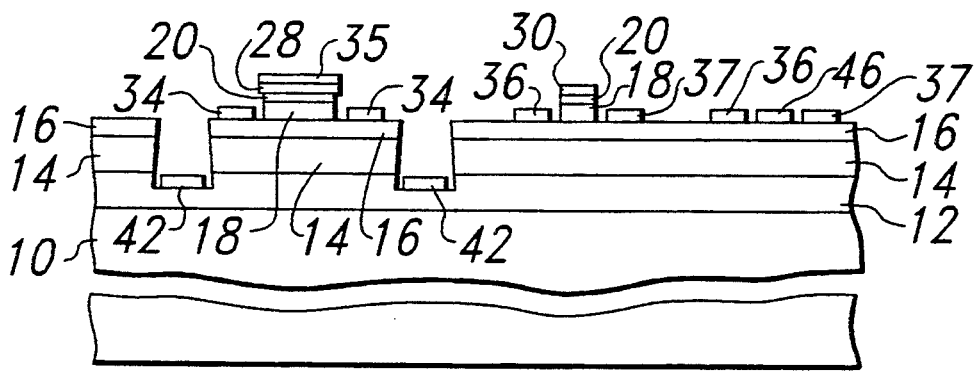
FIG. 10 is a cross-sectional view of the fourth preferred embodiment device.

A fourth preferred embodiment structure combines the HBT and JFET of the first preferred embodiment with the MESFET structure of the second preferred embodiment. All three device types can be formed simultaneously with little or no additional process steps as shown in FIG. 10.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit comprising the steps of:
   forming a metal emitter contact and a gate contact simultaneously on a layer adjacent an emitter layer in a material structure comprising:
   a collector layer;
   a base layer; and
   said emitter layer;
   removing said emitter layer from areas not covered by said emitter contact and said gate contact;
   forming metal on said base layer to simultaneously form at least one base contact, a drain contact, and a source contact; and
   removing a portion of said base layer to isolate a source/channel/drain region of a field affect transistor from a base mesa of a bipolar transistor.

2. The method of claim 1 wherein said baselayer is approximately 50 nm in thickness and is doped at a concentration of approximately $2 \times 10^{18}$ cm$^{-3}$.

3. The method of claim 1 further comprising the step of depositing metal to form a Schottky barrier gate contact to said base layer.

4. The method of claim 1 wherein said base layer is GaAs and said emitter layer is AlGaAs.

5. The method of claim 1 wherein said bipolar transistor is a heterojunction bipolar transistor.

6. The method of claim 1 further comprising the step of doping said collector layer to be p-type, said base layer to be n-type, and said emitter layer to be p-type.

7. The method of claim 1 further comprising the steps of:
   forming a subcollector layer adjacent said collector layer;
   removing portions of said base and collector layers to expose a portion of said subcollector layer; and
   forming a backgate contact to said subcollector layer.

8. The method of claim 1 further comprising the steps of:
   forming a subcollector layer adjacent said collector layer;
   removing portions of said base and collector layers to expose a portion of said subcollector layer; and
   forming a collector contact to said subcollector layer.

9. A method of forming an integrated circuit, said method comprising the steps of:
   forming a metal emitter contact and a metal gate contact over a material structure comprising:
   a subcollector layer;
   a collector layer;
   a base layer; and
   an emitter layer;
   removing said emitter layer from areas not covered by said emitter contact and said metal gate contact;
   forming metal on said base layer to simultaneously form at least one base contact, a drain contact, and a source contact;
   removing portions of said base and collector layers to expose a portion of said subcollector layer;
   forming a collector contact to said subcollector layer; and
   removing a portion of said base layer to isolate a source/channel/drain region of a field effect transistor from a base mesa of a bipolar transistor.

10. The method of claim 9 further comprising the step of forming a backgate contact to said subcollector layer.

11. The method of claim 10 further comprising the step of connecting said backgate contact to said gate contact.

12. The method of claim 9 further comprising the step of doping said collector layer to be p-type, said base layer to be n-type, and said emitter layer to be p-type.

* * * * *